(12) United States Patent
Nagao et al.

(10) Patent No.: US 8,798,226 B2
(45) Date of Patent: *Aug. 5, 2014

(54) PULSE OUTPUT CIRCUIT, SHIFT REGISTER AND ELECTRONIC EQUIPMENT

(71) Applicant: Semiconductor Energy Laboratory Co., Ltd., Atsugi (JP)

(72) Inventors: Sho Nagao, Tochigi (JP); Yoshifumi Tanada, Kanagawa (JP); Yutaka Shionoiri, Kanagawa (JP); Hiroyuki Miyake, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/760,147

(22) Filed: Feb. 6, 2013

(65) Prior Publication Data

US 2013/0251091 A1 Sep. 26, 2013

Related U.S. Application Data

(63) Continuation of application No. 11/467,022, filed on Aug. 24, 2006, now abandoned, which is a continuation of application No. 10/958,568, filed on Oct. 6, 2004, now Pat. No. 7,116,748, which is a continuation of application No. 10/756,428, filed on Jan. 14, 2004, now Pat. No. 6,813,332.

(30) Foreign Application Priority Data

Jan. 17, 2003 (JP) .................. 2003-010381

(51) Int. Cl.
*G11C 19/00* (2006.01)

(52) U.S. Cl.
USPC ................. 377/64; 377/78; 377/79

(58) Field of Classification Search
None
See application file for complete search history.

(56) References Cited

U.S. PATENT DOCUMENTS

| 4,682,047 A | 7/1987 | von Sichart |
| 5,425,074 A | 6/1995 | Wong |

(Continued)

FOREIGN PATENT DOCUMENTS

| CN | 1385825 A | 12/2002 |
| EP | 1253718 A1 | 10/2002 |

(Continued)

OTHER PUBLICATIONS

Taiwanese Office Action (Application No. 93100925) dated Mar. 30, 2010 with English translation, 9 pages.

*Primary Examiner* — Tuan T Lam
(74) *Attorney, Agent, or Firm* — Fish & Richardson P.C.

(57) ABSTRACT

A driver circuit of a display device, which includes TFTs of a single conductivity type and outputs an output signal with normal amplitude. A pulse is inputted to TFTs 101 and 104 to turn ON the TFTs and a potential of a node α is raised. When the potential of the node α reaches (VDD−VthN), the node α becomes in a floating state. Accordingly, a TFT 105 is turned ON and a potential of an output node is raised as a clock signal becomes High level. On the other hand, a potential of a gate electrode of the TFT 105 is further raised due to an operation of a capacitance means 107 as the potential of the output node is raised, so that the potential of the gate electrode of the TFT 105 becomes higher than (VDD+VthN). Thus, the potential of the output node is raised to VDD without causing a voltage drop due to a threshold voltage of the TFT 105. An output at the subsequent stage is then inputted to a TFT 103 to turn the TFT 103 ON, while the potential of the node α of TFTs 102 and 106 is dropped to turn the TFT 105 OFF. As a result, the potential of the output node becomes Low level.

14 Claims, 10 Drawing Sheets

(56) References Cited

U.S. PATENT DOCUMENTS

| | | |
|---|---|---|
| 5,434,899 A | 7/1995 | Huq et al. |
| 5,701,136 A | 12/1997 | Huq et al. |
| 5,859,630 A | 1/1999 | Huq |
| 5,900,768 A | 5/1999 | Price |
| 5,949,271 A | 9/1999 | Fujikura |
| 6,064,713 A * | 5/2000 | Lebrun et al. .................. 377/67 |
| 6,292,030 B1 | 9/2001 | Shih |
| 6,300,928 B1 | 10/2001 | Kim |
| 6,525,572 B1 | 2/2003 | Barnes |
| 6,566,914 B2 | 5/2003 | Bruneau et al. |
| 6,690,347 B2 | 2/2004 | Jeon et al. |
| 6,788,108 B2 | 9/2004 | Miyake et al. |
| 6,876,353 B2 | 4/2005 | Morosawa et al. |
| 6,928,136 B2 | 8/2005 | Nagao et al. |
| 6,958,750 B2 | 10/2005 | Azami et al. |
| 6,975,142 B2 | 12/2005 | Azami et al. |
| 7,057,598 B2 | 6/2006 | Azami et al. |
| 7,091,749 B2 | 8/2006 | Miyake et al. |
| 7,151,278 B2 | 12/2006 | Nagao et al. |
| 7,289,593 B2 * | 10/2007 | Tobita et al. .................. 377/64 |
| 7,362,139 B2 | 4/2008 | Miyake et al. |
| 7,382,347 B2 * | 6/2008 | Sasaki et al. .................. 345/100 |
| 7,394,102 B2 | 7/2008 | Nagao et al. |
| 7,522,145 B2 | 4/2009 | Lee et al. |
| 7,586,478 B2 | 9/2009 | Azami et al. |
| RE41,215 E | 4/2010 | Miyake et al. |
| 7,710,384 B2 | 5/2010 | Azami et al. |
| 2002/0158666 A1 | 10/2002 | Azami et al. |
| 2002/0167026 A1 | 11/2002 | Azami et al. |
| 2002/0190326 A1 | 12/2002 | Nagao et al. |
| 2003/0011584 A1 | 1/2003 | Azami et al. |
| 2003/0020520 A1 | 1/2003 | Miyake et al. |
| 2003/0034806 A1 | 2/2003 | Azami |
| 2003/0052324 A1 | 3/2003 | Kimura |
| 2003/0111677 A1 | 6/2003 | Miyake |
| 2008/0174589 A1 | 7/2008 | Nagao et al. |
| 2010/0073348 A1 | 3/2010 | Azami et al. |

FOREIGN PATENT DOCUMENTS

| | | |
|---|---|---|
| JP | 2001-060398 A | 3/2001 |
| JP | 2001-101889 A | 4/2001 |
| JP | 2001-273785 A | 10/2001 |
| JP | 2001-282169 A | 10/2001 |
| JP | 2002-328643 A | 11/2002 |
| JP | 2002-335153 A | 11/2002 |
| JP | 2003-016794 A | 1/2003 |
| JP | 2003-101394 A | 4/2003 |

* cited by examiner

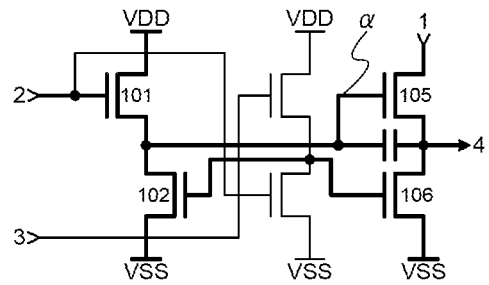
FIG. 6A
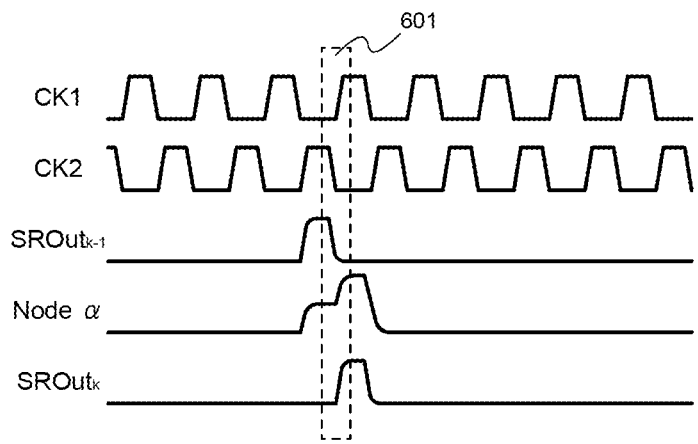
FIG. 6B
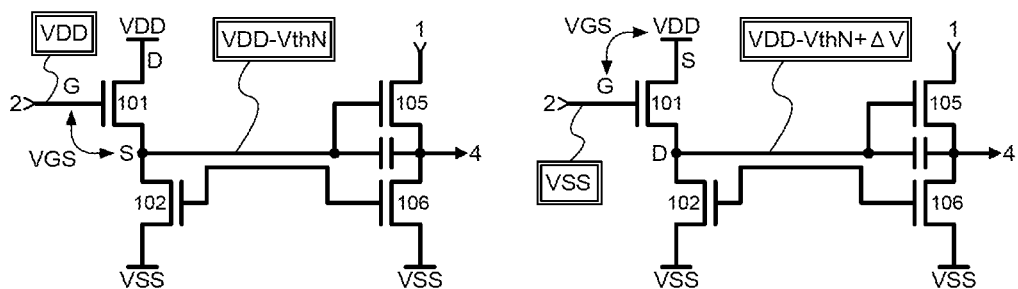
FIG. 6C
FIG. 6D

PULSE OUTPUT CIRCUIT, SHIFT REGISTER AND ELECTRONIC EQUIPMENT

CROSS-REFERENCE TO RELATED APPLICATIONS

This application is a continuation of U.S. application Ser. No. 11/467,022, filed Aug. 24, 2006, now abandoned, which is a continuation of U.S. application Ser. No. 10/958,568, filed Oct. 6, 2004, now U.S. Pat. No. 7,116,748, which is a continuation of U.S. application Ser. No. 10/756,428, filed Jan. 14, 2004, now U.S. Pat. No. 6,813,332, which claims the benefit of a foreign priority application filed in Japan as Serial No. 2003-010381 on Jan. 17, 2003, all of which are incorporated by reference.

BACKGROUND OF THE INVENTION

1. Field of the Invention

The present invention relates to a pulse output circuit, a shift register and a display device.

2. Description of the Related Art

In recent years, a display device in which a circuit is formed on an insulating substrate, specifically on a glass or plastic substrate, by using thin film transistors (hereinafter referred to as TFTs) formed of a semiconductor thin film has been developed. Specifically, development of an active matrix display device has been remarkably advanced. The active matrix display device formed of TFTs includes hundred thousands to millions of pixels which are arranged in matrix, and the TFTs provided in each pixel control the charge of each pixel to display an image.

Further, polysilicon TFTs which have excellence in electrical properties have been developed instead of amorphous TFTs. By using the polysilicon TFTs, a method of forming a driver circuit in the periphery of a pixel portion simultaneously with a pixel TFT constituting a pixel has been developed as a recent technology. The method makes a significant contribution to reduction in size, weight and power consumption of the device, therefore, it is becoming an essential technology for forming the display portion of a portable information terminal or the like whose application fields are remarkably expanding in recent years.

In general, a CMOS circuit which is formed with the combination of an N-type TFT and a P-type TFT is used for a circuit constituting a driver circuit of the display device. The CMOS circuit is characterized in that there is a current flow only when the logic is inverted (from High level to Low level or from Low level to High level), and ideally, there is no current flow while retaining certain data (practically, there is a small amount of leak current flow). Therefore, the CMOS circuit has the advantage of being cable of reducing power consumption considerably in the whole circuit and of operating at high speed because the P-type TFT and the N-type TFT complement each other However, as for the manufacturing step of the CMOS circuit, the number of steps is increased due to the complicated steps of ion doping or the like, and thus, it is difficult to reduce the production cost. Consequently, a circuit which is formed of TFTs of a single conductivity type, that is, either of N-type TFTs or P-type TFTs, and is capable of operating at as high speed as a CMOS circuit has been proposed instead of a conventional circuit formed of a CMOS circuit (see Patent Document 1, for example).

According to a circuit disclosed in Patent Document 1, as shown in FIGS. 2A to 2C, a gate electrode of a TFT 205 connected to an output terminal is made temporarily in a floating state, and by using capacitive coupling between a gate and source of the TFT 205, the potential of the gate electrode can be made higher than a power source potential. As a result, an output without amplitude attenuation can be obtained without causing a voltage drop due to a threshold voltage of the TFT 205.

Such operation in the TFT 205 is known as a bootstrap operation. This operation facilitates the output of pulse without causing a voltage drop due to a threshold voltage of the TFT.

[Patent Document 1]

Japanese Patent Laid-Open No. 2002-335153

With reference to a pulse output circuit shown in FIG. 2B, a potential of an output node is focused. FIG. 2C shows operation timing of a shift register shown in FIG. 2A. During a period in which no pulse is inputted and outputted, potentials of input terminals 2 and 3 in the pulse output circuit shown in FIG. 2B are Low level, that is, TFTs 201 to 204 are all turned OFF. As a result, gate electrodes of the TFT 205 and a TFT 206 both become in a floating state.

At this time, either a clock signal CK 1 or a clock signal CK 2 is inputted to an input terminal 1, namely a drain region of the TFT 205 which corresponds to a first electrode of the TFT 205 (as to source and drain regions of the TFT 205, a lower potential part is referred to as a source region and a higher potential part is referred to as a drain region herein). Due to a capacitive coupling with the drain region, the potential of the gate electrode of the TFT 205 which is in a floating state, namely a potential of a node α is varied as noise in accordance with a dock signal as shown in FIG. 2C with a reference numeral 250.

This variation in potential is much smaller as compared with pulses with normal amplitude, therefore, it is not so serious when a power source voltage (potential difference between VDD and VSS) is sufficiently large. That is, there is few possibility of the malfunction of the TFT 205 caused by the variation in potential such as noise. However, the TFT 205 is likely to malfunction in the case of adopting a low voltage operation to reduce power consumption or the like.

In view of the foregoing, it is the primary object of the invention to provide a pulse output circuit and a shift register which are capable of reducing the noise in a circuit and operating more accurately.

SUMMARY OF THE INVENTION

To solve the above-described problems, the following measures are taken in the invention.

One of the reasons why the potential is varied as noise during a period in which there is no output of pulse is that both the TFTs 205 and 206 are in a floating state and a signal having amplitude such as a clock signal is inputted to the drain region of the TFT 205.

Therefore, according to the invention, a TFT such as the TFT 205 to which is inputted a signal having amplitude such as a clock signal is configured so as to be fixed its ON or OFF during a period in which there is no output of pulse.

It is to be noted that in this specification, it is defined that a display device includes a liquid crystal display device in which liquid crystal elements are used as pixels and a display device in which self-luminous elements such as electro luminescence (EL) elements are used as pixels. It is also defined that a driver circuit of the display device is a circuit for inputting an image signal into a pixel disposed in the display device to carry out a step of displaying an image and includes a pulse output circuit such as shift register and inverter and an amplification circuit such as amplifier.

A pulse output circuit according to the invention comprises:
first to third input terminals;
an output terminal;
a first transistor including a first electrode electrically connected to the first input terminal;
a second transistor including a first electrode electrically connected to a power source;
a first amplitude compensation circuit;
a second amplitude compensation circuit; and
a capacitance means,
and in the pulse output circuit according to the invention:
channel regions of first and second transistors have a same conductivity type;
each of a second electrode of the first transistor and a second electrode of the second transistor is electrically connected to the output terminal;
the capacitance means is provided between a gate electrode of the first transistor and the second electrode of the first transistor;
the gate electrode of the first transistor is electrically connected to an output terminal of the first amplitude compensation circuit;
a gate electrode of the second transistor is electrically connected to an output terminal of the second amplitude compensation circuit;
the second input terminal is electrically connected to each of a first input terminal of the first amplitude compensation circuit and a first input terminal of the second amplitude compensation circuit;
the third input terminal is electrically connected to a second input terminal of the second amplitude compensation circuit; and
the output terminal of the second amplitude compensation circuit is electrically connected to a second input terminal of the first amplitude compensation circuit.

An output circuit according to the invention comprises:
first to third input terminals;
an output terminal;
a first transistor including a first electrode electrically connected to the first input terminal;
a second transistor including a first electrode electrically connected to a power source;
a first amplitude compensation circuit;
a second amplitude compensation circuit;
a capacitance means; and
a scanning direction switch circuit,
and in the pulse output circuit according to the invention:
channel regions of the first and second transistors have a same conductivity type;
each of a second electrode of the first transistor and a second electrode of the second transistor is electrically connected to the output terminal;
the capacitance means is provided between a gate electrode of the first transistor and the second electrode of the first transistor;
the gate electrode of the first transistor is electrically connected to an output terminal of the first amplitude compensation circuit;
a gate electrode of the second transistor is electrically connected to an output terminal of the second amplitude compensation circuit;
the second input terminal is electrically connected to a first input terminal of the first amplitude compensation circuit and to either a first input terminal of the second amplitude compensation circuit or a second input terminal of the second amplitude compensation circuit via the scanning direction switch circuit;
the third input terminal is electrically connected to the input terminal of the first amplitude compensation circuit and to either the first input terminal of the second amplitude compensation circuit or the second input terminal of the second amplitude compensation circuit via the scanning direction switch circuit;
the output terminal of the second amplitude compensation circuit is electrically connected to a second input terminal of the first amplitude compensation circuit;
when the scanning direction switch circuit is in a first state, a signal inputted to the second input terminal is inputted to each of the first input terminal of the first amplitude compensation circuit and the first input terminal of the second amplitude compensation circuit, and a signal inputted to the third input terminal is inputted to the second input terminal of the second amplitude compensation circuit; and
when the scanning direction switch circuit is in a second state, a signal inputted to the second input terminal is inputted to the second input terminal of the second amplitude compensation circuit, and a signal inputted to the third input terminal is inputted to each of the first input terminal of the first amplitude compensation circuit and the first input terminal of the second amplitude compensation circuit.

A pulse output circuit according to the invention comprises:
first to fourth input terminals;
an output terminal;
a first transistor including a first electrode electrically connected to the first input terminal;
a second transistor including a first electrode electrically connected to a first power source;
a third transistor including a first electrode electrically connected to a second power source;
first and second amplitude compensation circuits; and
a capacitance means,
and in the pulse output circuit according to the invention:
channel regions of all the first, second and third transistors have a same conductivity type;
each of a second electrode of the first transistor and a second electrode of the second transistor is electrically connected to the output terminal;
the capacitance means is provided between a gate electrode of the first transistor and the second electrode of the first transistor;
the gate electrode of the first transistor is electrically connected to an output terminal of the first amplitude compensation circuit;
a gate electrode of the second transistor is electrically connected to an output terminal of the second amplitude compensation circuit;
the second input terminal is electrically connected to each of a first input terminal of the first amplitude compensation circuit and a first input terminal of the second amplitude compensation circuit;
the third input terminal is electrically connected to a second input terminal of the second amplitude compensation circuit;
the output terminal of the second amplitude compensation circuit is electrically connected to a second input terminal of the first amplitude compensation circuit.
the fourth input terminal is electrically connected to a gate electrode of the third transistor; and
a second electrode of the third transistor is electrically connected to the gate electrode of the second transistor.

A pulse output circuit according to the invention comprises:
first to third input terminals;
an output terminal;
a first transistor including a first electrode electrically connected to the first input terminal;
a second transistor including a first electrode electrically connected to a first power source;
a third transistor including a first electrode electrically connected to a second power source or a gate electrode thereof;
a fourth transistor including a first electrode electrically connected to the first power source;
a fifth transistor including a first electrode electrically connected to the second power source;
a sixth transistor including a first electrode electrically connected to the first power source; and
a capacitance means,
and in the pulse output circuit according to the invention:
channel regions of all the first to sixth transistors have a same conductivity type;
each of a second electrode of the first transistor and a second electrode of the second transistor is electrically connected to the output terminal;
the capacitance means is provided between a gate electrode of the first transistor and the second electrode of the first transistor;
each of a second electrode of the third transistor and a second electrode of the fourth transistor is electrically connected to the gate electrode of the first transistor;
each of a second electrode of the fifth transistor and a second electrode of the sixth transistor is electrically connected to a gate electrode of the second transistor and to a gate electrode of the fourth transistor;
each of a gate electrode of the third transistor and a gate electrode of the sixth transistor is electrically connected to the second input terminal; and
a gate electrode of the fifth transistor is electrically connected to the third input terminal.

The above-mentioned pulse output circuit may comprise a seventh transistor, and the seventh transistor may include a gate electrode electrically connected to the second power source and be provided between an output electrode of the third transistor and the gate electrode of the first transistor.

The above-mentioned pulse output circuit may comprise:
a seventh transistor including a first electrode connected to a gate electrode thereof; and
an eighth transistor including a first electrode electrically connected to the first power source,
and in the pulse output circuit according to the invention:
the seventh transistor may be provided between the output electrode of the third transistor and the gate electrode of the first transistor; and
a gate electrode of the eighth transistor may be electrically connected to each of the gate electrode of the second transistor and the gate electrode of the fourth transistor, and a second electrode of the eighth transistor may be electrically connected to the gate electrode of the first transistor.

A pulse output circuit comprises:
first to third input terminals;
an output terminal;
a first transistor including a first electrode electrically connected to the first input terminal;
a second transistor including a first electrode electrically connected to a first power source;
a third transistor including a first electrode electrically connected to a second power source or a gate electrode thereof;
a fourth transistor including a first electrode electrically connected to the first power source;
a fifth transistor including a first electrode electrically connected to the second power source;
a sixth transistor including a first electrode electrically connected to the first power source;
a capacitance means; and
a scanning direction switch circuit,
and in the pulse output circuit according to the invention:
channel regions of all the first to sixth transistors have a same conductivity type;
each of a second electrode of the first transistor and a second electrode of the second transistor is electrically connected to the output terminal;
the capacitance means is provided between a gate electrode of the first transistor and the second electrode of the first transistor;
each of a second electrode of the third transistor and a second electrode of the fourth transistor is electrically connected to the gate electrode of the first transistor;
each of a second electrode of the fifth transistor and a second electrode of the sixth transistor is electrically connected to a gate electrode of the second transistor and to a gate electrode of the fourth transistor;
each of a gate electrode of the third transistor and a gate electrode of the sixth transistor is electrically connected to the second input terminal or the third input terminal via the scanning direction switch circuit;
a gate electrode of the fifth transistor is electrically connected to the second input terminal or the third input terminal via the scanning direction switch circuit;
when the scanning direction switch circuit is in a first state, a signal inputted to the second input terminal is inputted to each of the gate electrode of the third transistor and the gate electrode of the sixth transistor, and a signal inputted to the third input terminal is inputted to the gate electrode of the fifth transistor; and
when the scanning direction switch circuit is in a second state, a signal inputted to the second input terminal is inputted to the gate electrode of the fifth transistor, and a signal inputted to the third input terminal is inputted to each of the gate electrode of the third transistor and the gate electrode of the sixth transistor.

The above-mentioned pulse output circuit may comprise a seventh transistor, and the seventh transistor may include a gate electrode electrically connected to the second power source and be provided between the output electrode of the third transistor and the gate electrode of the first transistor.

The above-mentioned pulse output circuit may comprise:
a seventh transistor including a first electrode connected to a gate electrode thereof; and
an eighth transistor including a first electrode electrically connected to the first power source,
and in the pulse output circuit according to the invention:
the seventh transistor may be provided between an output electrode of the third transistor and the gate electrode of the first transistor; and
a gate electrode of the eighth transistor may be electrically connected to each of the gate electrode of the second transistor and the gate electrode of the fourth transistor, and a second electrode of the eighth transistor may be electrically connected to the gate electrode of the first transistor.

A pulse output circuit according to the invention comprises:
first to fourth input terminals;
an output terminal;
a first transistor including a first electrode electrically connected to the first input terminal;
a second transistor including a first electrode electrically connected to a first power source;
a third transistor including a first electrode electrically connected to a second power source or a gate electrode thereof;
a fourth transistor including a first electrode electrically connected to the first power source;
a fifth transistor including a first electrode electrically connected to the second power source;
a sixth transistor including a first electrode electrically connected to the first power source;
a seventh transistor including a first electrode electrically connected to the second power source; and
a capacitance means,
and in the pulse output circuit according to the invention:
channel regions of all the first to seventh transistors have a same conductivity type;
each of a second electrode of the first transistor and a second electrode of the second transistor is electrically connected to the output terminal;
the capacitance means is provided between a gate electrode of the first transistor and the second electrode of the first transistor;
each of a second electrode of the third transistor and a second electrode of the fourth transistor is electrically connected to the gate electrode of the first transistor;
each of a second electrode of the fifth transistor, a second electrode of the sixth transistor and a second electrode of the seventh transistor is electrically connected to a gate electrode of the second transistor and to a gate electrode of the fourth transistor;
each of a gate electrode of the third transistor and a gate electrode of the sixth transistor is electrically connected to the second input terminal;
a gate electrode of the fifth transistor is electrically connected to the third input terminal; and
a gate electrode of the seventh transistor is electrically connected to the fourth input terminal.

The above-mentioned pulse output circuit may comprise an eighth transistor, and the eighth transistor may include a gate electrode electrically connected to the second power source and be provided between an output electrode of the third transistor and the gate electrode of the first transistor.

The above-mentioned pulse output circuit may comprise:
an eighth transistor including a gate electrode electrically connected to a first electrode thereof; and
a ninth transistor including a first electrode electrically connected to the first power source,
and in the pulse output circuit according to the invention:
the eighth transistor may be provided between the output electrode of the third transistor and the gate electrode of the first transistor; and
a gate electrode of the ninth transistor may be electrically connected to each of the gate electrode of the second transistor and the gate electrode of the fourth transistor and a second electrode of the ninth transistor may be electrically connected to the gate electrode of the first transistor.

According to the invention a capacitance between the gate electrode and the second electrode of the first transistor may be used as the capacitance means.

According to the invention, a capacitance formed of first and second films each comprising either one of an active layer material, a gate electrode material and a wiring material, and of an insulating film provided between the first and second films may be used as the capacitance means.

A shift register is provided for example by using a plurality of stages of a pulse output circuit of the invention.

BRIEF DESCRIPTION OF THE DRAWINGS

FIGS. 6A to 6D are diagrams showing stresses which occur in operating TFTs in a pulse output circuit of the invention.

DETAILED DESCRIPTION OF THE PREFERRED EMBODIMENTS

Embodiment Mode

Figure 1A:
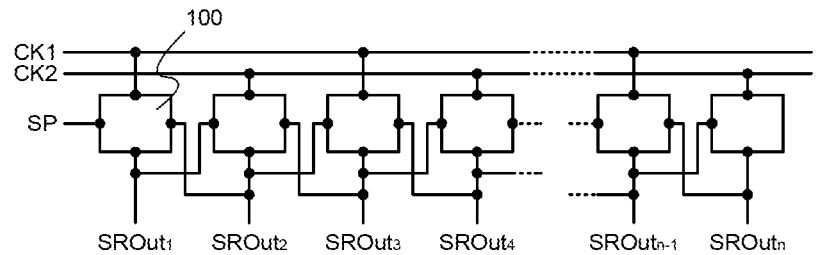
FIGS. 1A to 1C are diagrams showing an embodiment mode of the invention.
Figure 1B:
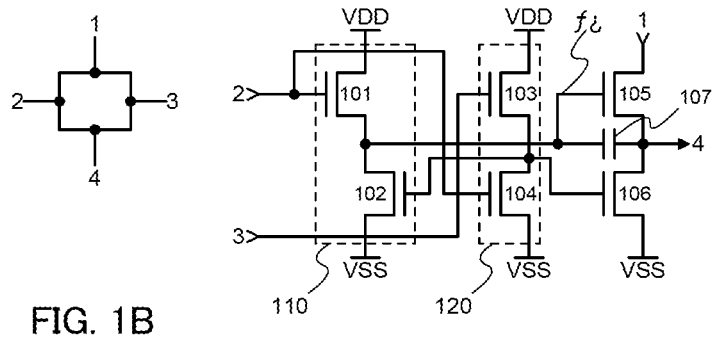

FIG. 1A shows a shift register which includes a plurality of stages of a pulse output circuit 100 of the invention. The shift register is controlled by a first clock signal CK 1, a second dock signal CK 2 and a start pulse SP. A configuration of the pulse output circuit 100 is shown in FIG. 1B. The pulse output circuit 100 includes TFTs 101 to 106 and a capacitance means 107. A part enclosed by a dotted line frame 110 corresponds to a first amplitude compensation circuit which includes the TFTs 101 and 102, and a part enclosed by a dotted line frame 120 corresponds to a second amplitude compensation circuit which includes the TFTs 103 and 104. The capacitance means 107 is provided between a gate and source of the TFT 105. The TFT 102 is connected and operates differently from that of a conventional configuration described in Patent Document 1.

Figure 1C:
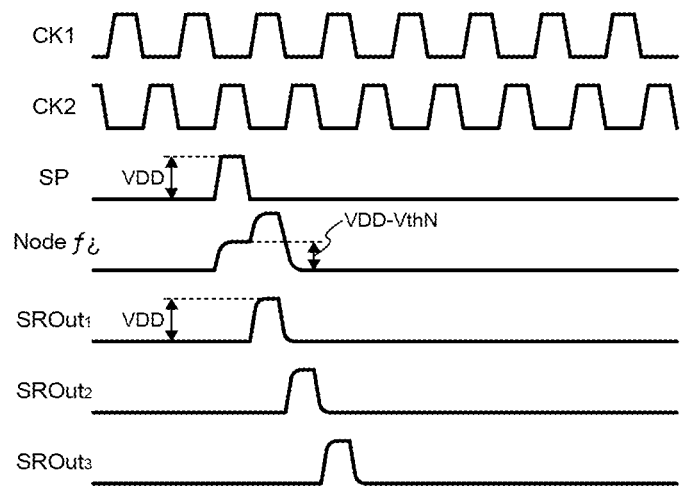
Figure 2A:
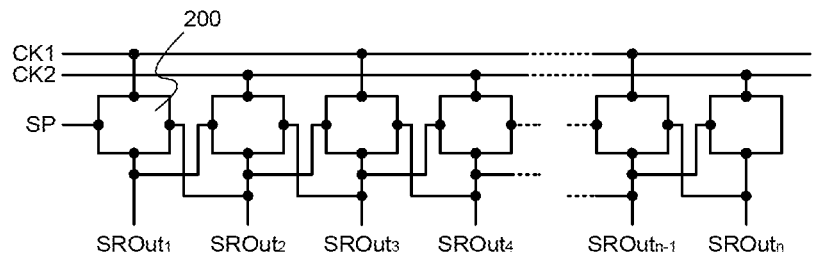
FIGS. 2A to 2C are diagrams showing a configuration of a conventional shift register and a pulse output circuit formed of TFTs of a single conductivity type.
Figure 2B:
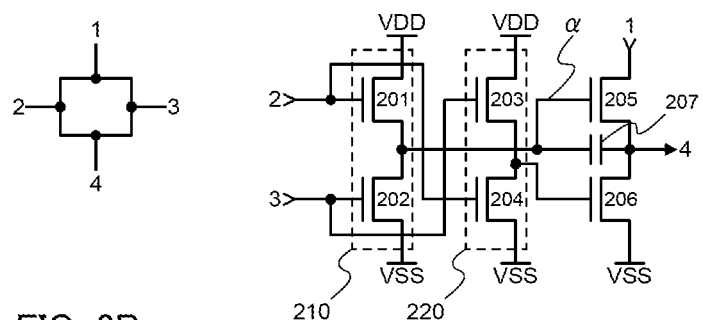
Figure 2C:
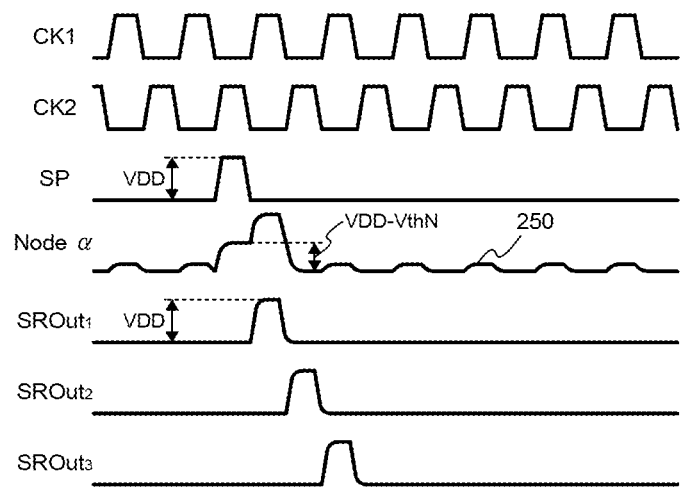

The operation will be explained. First, the CK 1, CK 2 and SP are inputted to the pulse output circuit 100 as shown in FIG. 1C. The amplitude of the CK 1, CK 2 and SP is herein defined to be VDD at High level and VSS at Low level (it is assumed here that VSS=0 for simplicity). The TFTs 101 and 104 are turned On when the SP is at High level, and then a potential of the gate electrode of the TFT 105, namely a potential of a node α is raised and potentials of gate electrodes of the TFTs 102 and 106 are dropped. A potential of a gate electrode of the TFT 103 is at Low level at this time and the TFT 103 is turned OFF.

The potentials of the gate electrodes of the TFTs 102 and 106 are dropped to VSS and thus the TFTs 102 and 106 are turned OFF. On the other hand, the TFT 101 is turned OFF when the potential of the node α is equal to (VDD−VthN) (VthN is herein defined to be a threshold voltage of the TFTs 101 to 106), and then the node α becomes in a floating state. Subsequently, the SP becomes at Low level and the TFTs 101 and 104 are turned OFF.

With respect to the TFT 105, the potential of the gate electrode of the TFT 105 is equal to (VDD−VthN) at this time. In the case where the voltage between the gate and source of the TFT 105 is higher than the threshold voltage here, namely (VDD−TthN−Vss)>VthN, the TFT 105 is turned ON.

Then, a potential of an input terminal 1 connected to a drain region of the TFT 105, namely a potential of the CK 1 is raised. Since the TFT 105 is ON, a current flows between the source and drain of the TFT 105, and a potential of an output node (SROut 1), namely a potential of the source region of the TFT 105 starts to be raised. The gate and source of the TFT 105 are capacitively coupled by using the capacitance means 107, therefore, the potential of the gate electrode of the TFT 105, which is in a floating state due to the rise of the potential of the output node (SROut 1), starts to be raised again. In the end, the potential of the gate electrode of the TFT 105 becomes higher than (VDD+VthN) and the potential of the output node (SROut 1) reaches equal to VDD. The above is an operation for one stage, and a pulse is similarly outputted at a subsequent stage or latter (SROut 2, SROut 3).

That is, according to the amplitude compensation circuit including the TFTs 101 to 104, a potential of the gate electrode of the TFT 101 is temporarily in a floating state when a pulse is outputted to an output terminal. Therefore, by the use of the capacitive coupling, the potential higher than a power source VDD can be realized and an output pulse without amplitude attenuation can be obtained. The configuration is not particularly limited to this and, any configuration can be freely used as long as a gate electrode of a TFT connected to an output terminal can be made in a floating state by some sort of control pulse.

With respect to the SROut 1, the CK 1 is changed from High level to Low level after a pulse is outputted. In accordance with this change, the potential of the SROut 1 starts to be dropped. On the other hand, the same operation as the above is conducted at the second stage at the timing where the CK 2 becomes at High level, and then a pulse is outputted to an SROut 2. This pulse is inputted to an input terminal 3 at the first stage and the TFT 103 is thus turned ON. Accordingly, the potentials of the gate electrodes of the TFTs 102 and 106 are raised and the TFTs 102 and 106 are thus turned ON. In accordance with this, the potential of the gate electrode of the TFT 105 and the potential of the SROut 1 are dropped. Then, the TFT 103 is turned OFF when the output of the SROut 2 is changed from High level to Low level. The TFTs 102 and 106 become thus in a floating state at this time, and the state is continued at the first stage until the next SP is inputted.

In a conventional pulse output circuit, the gate electrode of the TFT 105 was in a floating state during a period in which there was no output of pulse. Meanwhile, according to this embodiment mode, the gate electrodes of the TFTs 102 and 106 are in a floating state during a period in which there is no output of pulse. Note that, both of the TFT 102 and the TFT 106 are in a floating state while being turned ON, therefore, the potential of the gate electrode of the TFT 105 and the potential of the output node (SROut 1) are determined to be at Low level via the TFTs 102 and 106. Particularly, the TFT 105 including the drain region to which the CK 1 is inputted is determined to be in an OFF state, thus the noise which was a problem in the conventional pulse output circuit is not generated at the gate electrode thereof, namely the node α.

Accordingly, the potential of the node α is relatively free from the clock signal influence as compared with the conventional pulse output circuit as shown in FIG. 1C. As a result, the circuit operation can be made more stable and the operation at a lower voltage can be expected.

EMBODIMENT

Embodiments of the invention will be described hereinafter.

Embodiment 1

Figure 3A:
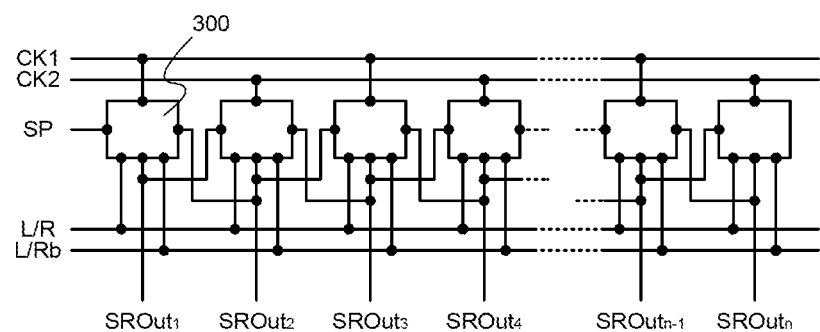
FIGS. 3A and 3B are diagrams showing an embodiment of the invention.
Figure 3B:
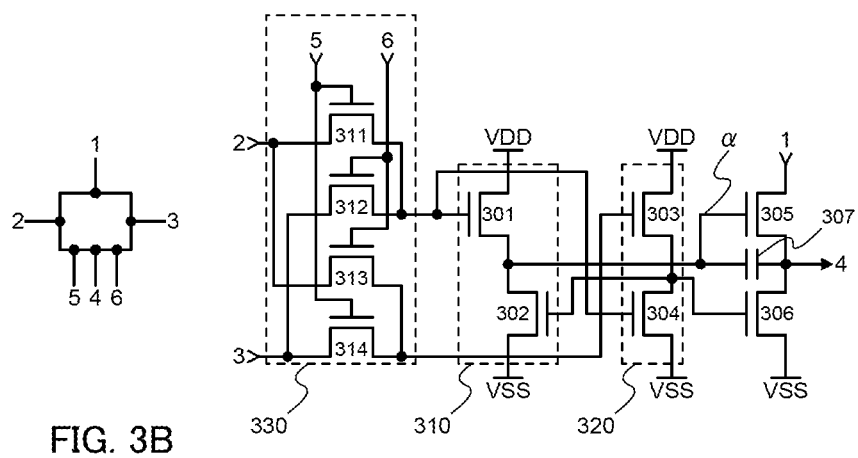

FIGS. 3A and 3B show an example of the shift register described in the embodiment mode, which is additionally provided with a scanning direction switch function. In FIG. 3A, input terminals of scanning direction switch signal L/R and of scanning direction switch back signal L/Rb are added to the shift register shown in FIG. 1A.

FIG. 3B shows a configuration of one stage of a pulse output circuit 300 in FIG. 3A. A main body of the pulse output circuit has the same configuration as that of FIG. 1B shown in the embodiment mode, while a scanning direction switch circuit 330 is additionally provided between the input signal terminals 2 and 3 and the main body of the pulse output circuit. The scanning direction switch circuit 330 includes TFTs 311 to 314.

As shown in FIG. 3B, gate electrodes of the TFTs 301 and 304 are connected to the input terminal 2 via the TFT 311 and to the input terminal 3 via the TFT 312. A gate electrode of the TFT 303 is connected to the input terminal 2 via the TFT 313 and to the input terminal 3 via the TFT 314. A scanning direction switch signal L/R is inputted to gate electrodes of the TFTs 311 and 314, and a scanning direction switch signal L/Rb is inputted to gate electrodes of the TFTs 312 and 313. The L/R and L/Rb are switched exclusively between High level and Low level, and thus, the scanning direction switch circuit in this embodiment is at the following two states.

First, the TFTs 311 and 314 is turned ON and the TFTs 312 and 313 are turned OFF when the L/R is at High level and the L/Rb is at Low level. Accordingly, a signal is inputted to the gate electrodes of the TFTs 301 and 304 from the input terminal 2 and to the gate electrode of the TFT 303 from the input terminal 3.

Second, the TFTs 312 and 313 are turned ON and the TFTs 311 and 314 are turned OFF when the L/R is at Low level and L/Rb is at High level. Accordingly, a signal is inputted to the gate electrodes of the TFTs 301 and 304 from the input terminal 3 and to the gate electrode of the TFT 303 from the input terminal 2.

That is, all that is required for the scanning direction switch circuit used herein is that a pulse at the preceding stage is inputted to one of the input terminals 2 and 3, a pulse at the subsequent stage is inputted to the other, and these operations can be selected arbitrarily by the external control. Although the scanning direction switch circuit is configured with the four TFTs 311 to 314 here, the configuration is just an example and is not limited to this.

That is, a pulse is outputted in order of the first stage, the second stage, . . . and the final stage when the scanning direction switch circuit is in a first state, to the contrary, a pulse is outputted in order of the final stage, . . . , the second stage and the first stage when the scanning direction switch circuit is in a second state. According to the invention, such functions can be easily provided by additionally providing a simple circuit. In this embodiment, a circuit includes the N-type TFTs, however, it is also possible to form a circuit by using the P-type TFTs. In the latter case, needless to say, the relations between High level and Low level of the signal and between ON and OFF of the TFT are contrary to these of this embodiment.

The scanning direction switch circuit shown in this embodiment is just an example. Similar functions may be added by the use of other configurations.

Embodiment 2

Figure 4A:
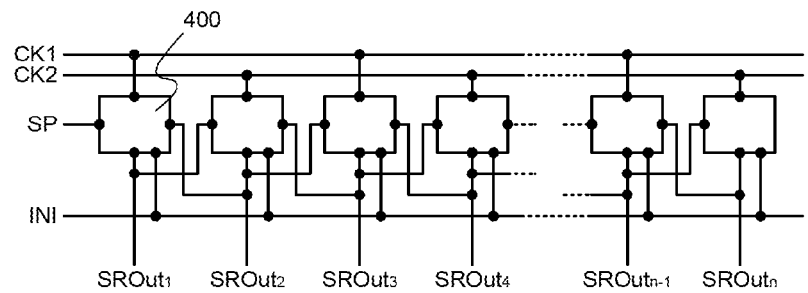
FIGS. 4A to 4C are diagrams showing an embodiment of the invention.

Explanation will be made on an example of the shift register described in the embodiment mode, which is additionally provided with an initialization signal (INI) as shown in FIG. 4A.

Figure 4B:
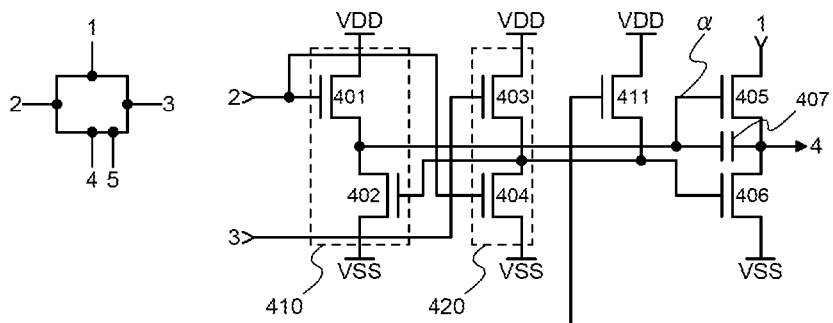

As shown in FIG. 4B, an initialization signal (INI) is inputted to a gate electrode of a TFT 411 added herein. When the TFT 411 is turned ON, a potential of a gate electrode of a TFT 406 is raised and the TFT 406 is turned ON, and thus, a potential of an output node is fixed at VSS.

Figure 4C:
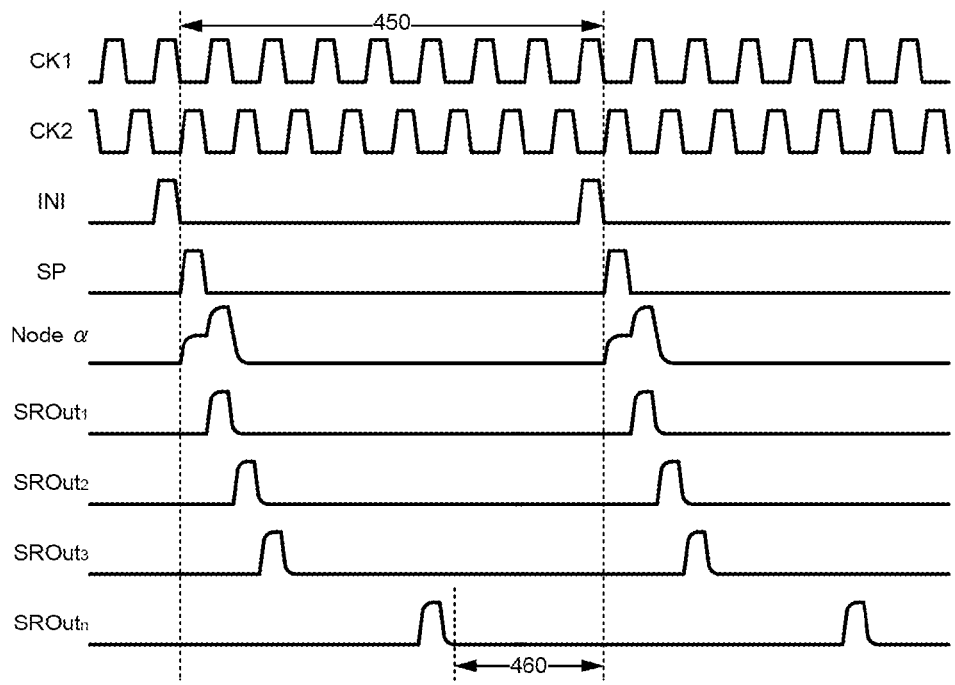

Potentials of the output nodes can be fixed as VSS at all the stages by performing such initialization before the circuit starts to output a sampling pulse, that is, just after the power source is turned on, or during a fly-back period 460 provided in a part of a line period 450 as shown in FIG. 4C. In the case of employing a dynamic circuit as shown in the invention (circuit in which at least one node is in a floating state while operating), such initialization of the node or the like is effective for realizing operation as stable as a static circuit and noise immunity.

Embodiment 3

Focused here are states of the TFTs 101, 102, 105, and 106 during a period in which the pulse output circuit described in the embodiment mode operates (see FIG. 6A).

FIG. 6B shows a state of each node when a pulse is outputted from the (k−1)th stage of the pulse output circuit and subsequently, a pulse is outputted from the kth stage of the pulse output circuit. Focused here is a period in which a bootstrap operation is conducted in accordance with a rising potential of an output node (SROutk) during a period enclosed by a dotted line frame 601, namely at the kth stage.

As explained in the embodiment mode, the TFT 101 is turned ON and the potential of the node α is raised to (VDD−VthN) when a pulse at the preceding stage (the (k−1)th stage here) is outputted and inputted to the input terminal 2 at the kth stage (see FIG. 6C). In such a state, the voltage between the gate and source of the TFT 101 becomes lower than the threshold voltage, thereby turning OFF the TFT 101. As a result, the node α becomes in a floating state while maintaining the potential thereof equal to (VDD−VthN).

Since the potential of the node α is less than VDD at this time, a side connected to the node α is a source region and the other side connected to a power source VDD is a drain region in the TFT 101.

Subsequently, when a clock signal (CK 1) is changed from Low level to High level, the gate and source of the TFT 105 are capacitively coupled and the potential of the node α is further raised from (VDD−VthN). The potential of the node α is then raised to be higher than (VDD+VthN) at this time (the potential is denoted as (VDD−VthN+ΔV) here), therefore, the potential of an output terminal is certainly raised to VDD without causing a voltage drop (see FIG. 6D).

At this time, the potential of the node α is higher than VDD, therefore, a side connected to the node α is a drain region and the other side connected to a power source VDD is a drain region in the TFT 101.

In the TFT 101, the voltage between the gate and source is |VthN| and the voltage between the gate and drain is 0 in a state shown in FIG. 6C. Meanwhile, the voltage between the gate and drain is |VSS−(VDD−VthN+ΔV)| and the voltage between the gate and source is |VSS−VDD| in a state shown in FIG. 6D. Accordingly, at the moment when a pulse is outputted to the output terminal in the TFT 101, the state shown in FIG. 6C is changed to that shown in FIG. 6D and a large negative value of bias voltage is applied both between the gate and source and between the gate and drain. Therefore, a large stress is applied and may cause degradation.

Figure 7A:
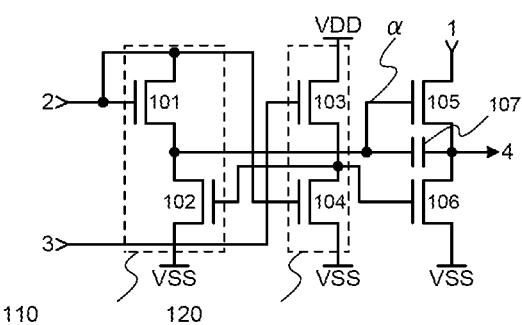
FIGS. 7A to 7C are diagrams showing an embodiment of the invention in which a configuration to reduce stresses is additionally provided.

In order to overcome the above, the way of connecting the TFT 101 is changed as shown in FIG. 7A. While one of the source region and the drain region of the TFT 101 is connected to the power source VDD and the other is connected to the node α in the embodiment mode, the region connected to the power source VDD is connected to the gate electrode of the TFT 101, namely to the input terminal 2 in this embodiment.

Figure 7B:
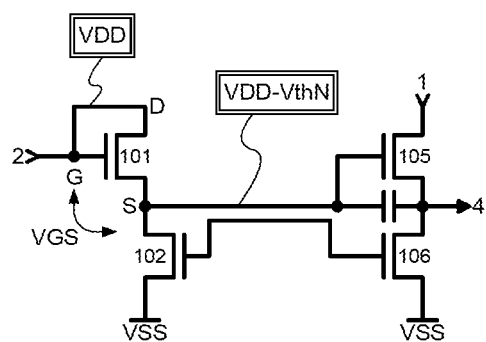

Explanation is made on a state of the TFT 101 in the case where the same operation as the above is conducted with this configuration. A state shown in FIG. 7B corresponds to the state shown in FIG. 6B and a state shown in FIG. 7C corresponds to the state shown in FIG. 6D. In FIG. 7B, the voltage between the gate and source of the TFT 101 is equal to |VthN| and the voltage between the gate and drain is always 0 because a node is connected. The voltage between the gate and source of the TFT 101 is changed to |VSS−(VDD−VthN+ΔV)| in FIG. 7C, however, the voltage between the gate and drain remains 0.

Accordingly, a large negative value of bias voltage is not applied between the gate and drain unlike the configuration shown in the embodiment mode, thus the degradation of the TFT 101 due to stresses can be suppressed.

Figure 8A:
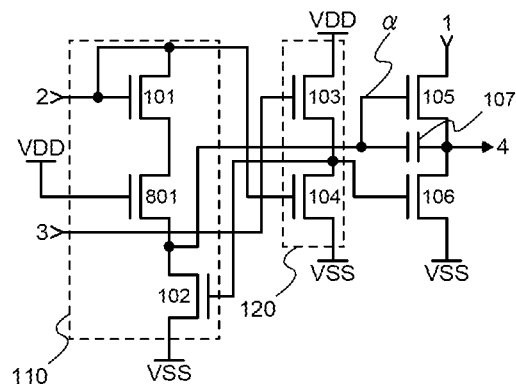
FIGS. 8A to 8C are diagrams showing an embodiment of the invention in which a configuration to reduce stresses is additionally provided.

Further, another configuration for suppressing degradation due to a negative bias voltage applied to the TFT 101 is shown in FIG. 8A. In this configuration, a TFT 801 including a gate electrode connected to a power source VDD is provided between the TFTs 101 and 102.

Explanation is made on the case in which the same operation as the above is conducted with this configuration. A state shown in FIG. 8B corresponds to the state shown in FIG. 7B and a state shown in FIG. 8C corresponds to the state shown in FIG. 7C. In FIG. 8B, the voltage between the gate and source of the TFT 101 is equal to |VthN| and the voltage between the gate and drain of the TFT 101 is always 0 because a node is connected. Since a potential of a gate electrode of the TFT 801 is equal to VDD, voltage drop is not caused between the source and drain in the TFT. That is, the potential of the node α is equal to (VDD−VthN).

Subsequently, in the state shown in FIG. 8C, the potential of the node α is raised to (VDD−VthN+ΔV). However, as the TFT 801 is provided here, the potential of the source region of the TFT 101 is not raised to more than (VDD−VthN). That is, as compared with the state shown in FIG. 7C, the negative value of bias voltage applied between the gate and source is smaller. In the TFT 801, the potential of the source region and the drain region is respectively equal to (VDD−VthN) and (VDD−VthN+ΔV), and the potential of the gate electrode is not changed and remains VDD. Therefore, the negative value of bias voltage in the TFT 801 is small.

Figure 7C:
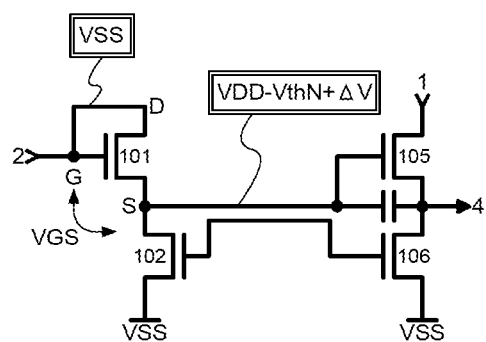
Figures 8B, 8C:
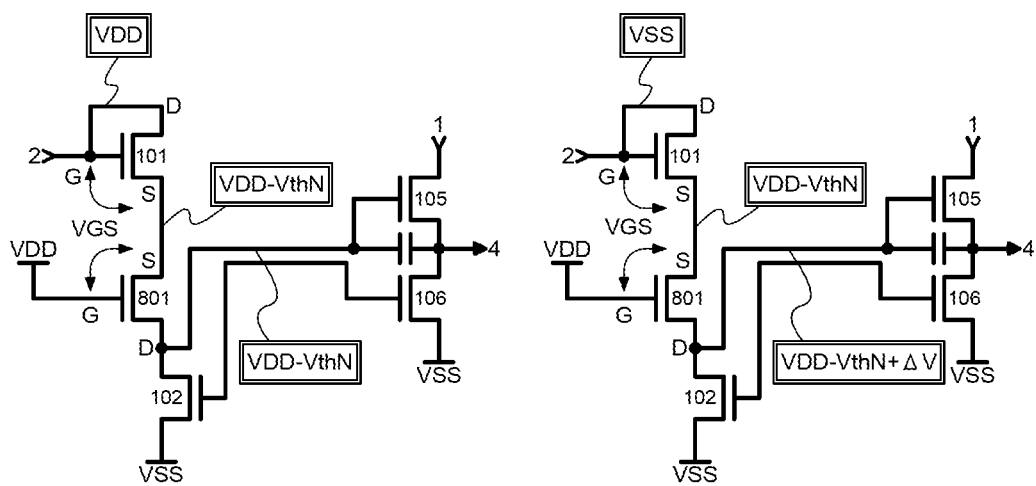

As a result, the negative value of bias voltage applied between the gate and source of the TFT can be made smaller as compared with the configuration shown in FIGS. 7A to 7C, thus the degradation of the TFT 101 caused by stresses can be further suppressed.

Figure 9A:
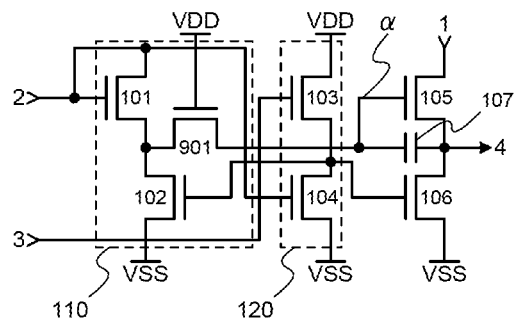
FIGS. 9A to 9C are diagrams showing an embodiment of the invention in which a configuration to reduce stresses is additionally provided.
Figure 9B:
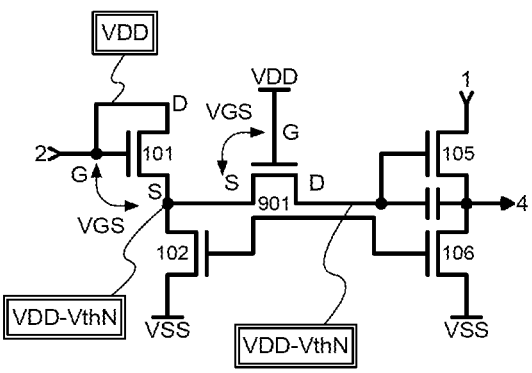
Figure 9C:
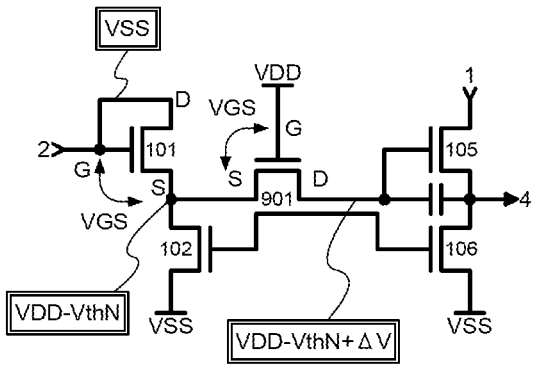

The TFT 801 provided in FIG. 8A may be provided between the source region of the TFT 101 and the gate electrode of the TFT 105, namely the node α as shown in FIG. 9A with a TFT 901. By using this configuration, the same effect can be realized as shown in FIGS. 9B and 9C.

Figure 10A:
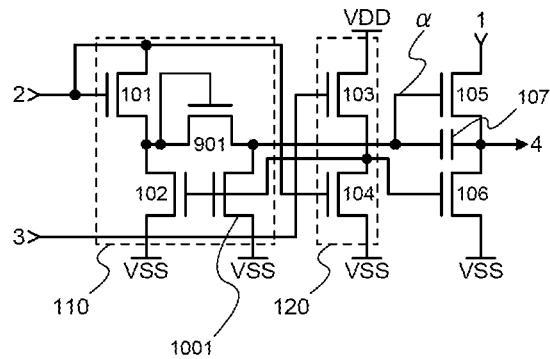
FIGS. 10A to 10D are diagrams showing an embodiment of the invention in which a configuration to reduce stresses is additionally provided.
Figure 10B:
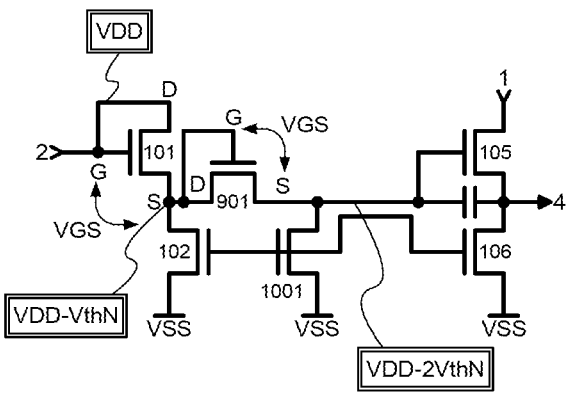
Figure 10C:
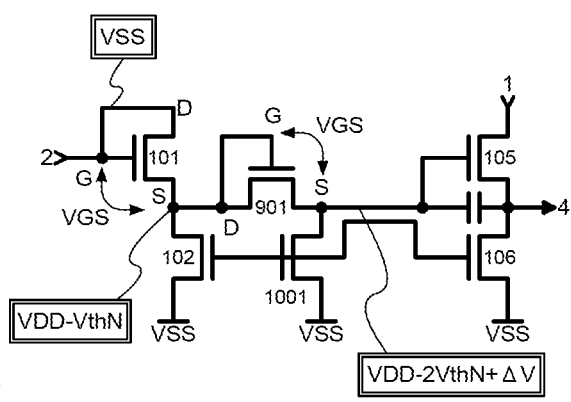
Figure 10D:
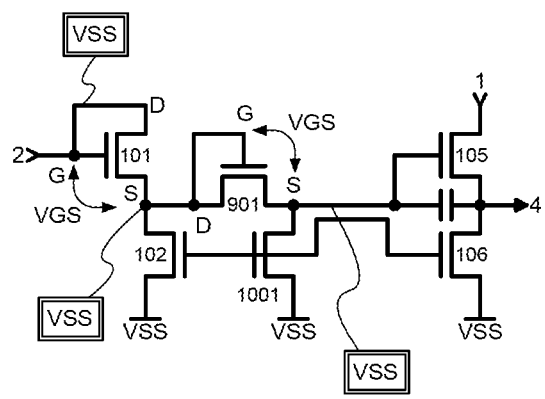

Further, as shown in FIG. 10A, a gate electrode and a drain electrode of the TFT 901 may be connected to each other to obtain a configuration having rectifying properties as a diode. In this configuration, the potential of the source region of the TFT 101 remains equal to (VDD−VthN) as shown in FIGS. 10B and 10C and a large negative value of bias voltage is not applied.

However, there is no current flow from a source region to a drain region of the TFT 901 when a pulse at the subsequent stage is outputted and a pulse at the relevant stage is changed from High level to Low level, and thus the TFT 102 is turned ON and the potential of the source region of the TFT 101 becomes equal to VSS. Therefore, there is no path to release charge accumulated at the node α. To overcome this, a TFT 1001 is additionally provided here, which is turned ON to drop the potential of the node α when a pulse at the subsequent stage is outputted.

Embodiment 4

According to the configurations shown in the embodiment mode and Embodiments 1 and 2, all the circuits are configured only with the N-type TFTs. However, in terms of using TFTs of a single conductivity type, a similar circuit may be configured only with the P-type TFTs. In the latter case, although not shown in figures, the circuit can be configured by using the TFTs connected in the same manner and by inverting the high potential and the low potential of the power source. Similarly, High level and Low level of signals to be inputted are all inverted.

Embodiment 5

The invention can be applied in manufacturing a display device used for various kinds of electronic equipment. Such electronic equipment includes a portable information terminal (electronic notebook, mobile computer and the like), a video camera, a digital camera, a personal computer, a television, a portable phone and the like. Examples thereof are shown in FIGS. 5A to 5G.

Figure 5A:
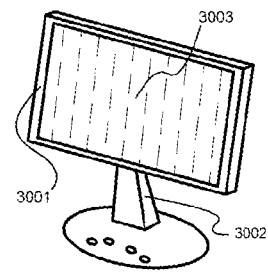
FIGS. 5A to 5G are views showing examples of electronic equipment to which the invention can be applied.

FIG. 5A shows a liquid crystal display (LCD) including a housing 3001, a holding stand 3002, a display portion 3003 and the like. The invention can be applied to the display portion 3003.

Figure 5B:
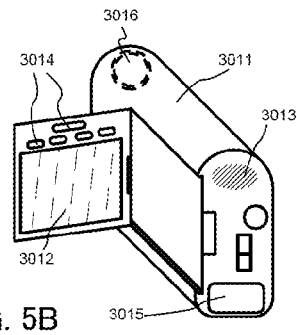

FIG. 5B shows a video camera including a main body 3011, a display portion 3012, a sound input portion 3013, operation switches 3014, a battery 3015, an image receiving portion 3016 and the like. The invention can be applied to the display portion 3012.

Figure 5C:
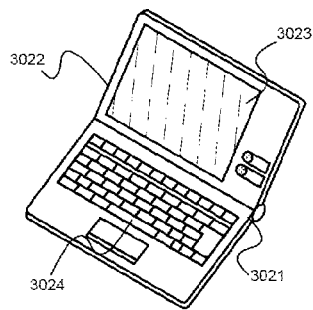

FIG. 5C shows a notebook type personal computer including a main body 3021, a housing 3022, a display portion 3023, a keyboard 3024 and the like. The invention can be applied to the display portion 3023.

Figure 5D:
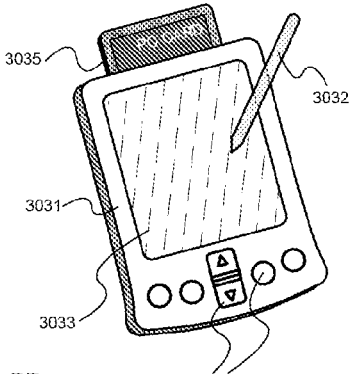

FIG. 5D shows a portable information terminal including a main body 3031, a stylus 3032, a display portion 3033, operation buttons 3034, an external interface 3035 and the like. The invention can be applied to the display portion 3033.

Figure 5E:
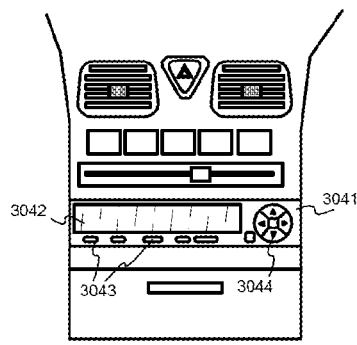

FIG. 5E shows an acoustic playback machine, specifically an audio apparatus mounted on an automobile, which includes a main body 3041, a display portion 3042, operation switches 3043 and 3044 and the like. The invention can be applied to the display portion 3042. Although an audio apparatus mounted on an automobile is shown as an example in this embodiment, the invention may be used in a portable or domestic audio machine.

Figure 5F:
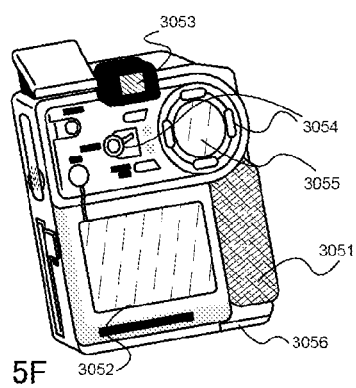

FIG. 5F shows a digital camera including a main body 3051, a display portion (A) 3052, an eyepiece portion 3053, operation switches 3054, a display portion (B) 3055, a battery 3056 and the like. The invention can be applied to the display portion (A) 3052 and the display portion (B) 3055.

Figure 5G:
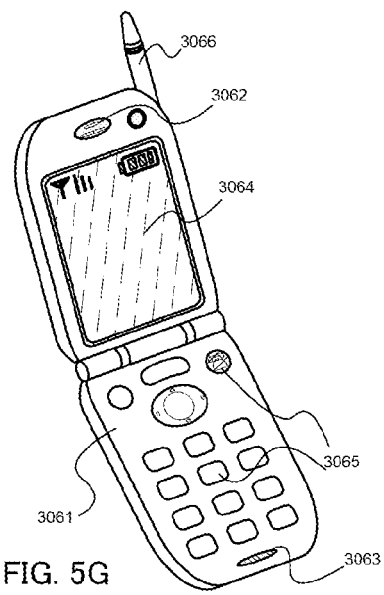

FIG. 5G shows a portable phone including a main body 3061, a sound output portion 3062, a sound input portion 3063, a display portion 3064, operation switches 3065, an antenna 3066 and the like. The invention can be applied to the display portion 3064.

It should be noted that the examples shown in this embodiment are only a part and the use of the invention is not limited to the above.

According to the invention, a driver circuit and a pixel portion of a display device can be configured with TFTs of a single conductivity type. Further, steps for manufacturing the display device can be reduced and this contributes to the reduction of cost and the improvement of yield, so that it is possible to provide the display device at a lower price.

What is claimed is:

1. A semiconductor device comprising:
a first transistor comprising a first gate, a first source, and a first drain;
a second transistor comprising a second gate, a second source, and a second drain;
a third transistor comprising a third gate, a third source, and a third drain;
a fourth transistor comprising a fourth gate, a fourth source, and a fourth drain;
a fifth transistor comprising a fifth gate, a fifth source, and a fifth drain;
a sixth transistor comprising a sixth gate, a sixth source, and a sixth drain;
a seventh transistor comprising a seventh gate, a seventh source, and a seventh drain; and
an eighth transistor comprising an eighth gate, an eighth source, and an eighth drain,
wherein the first gate is electrically connected to a first input terminal,
wherein the first gate is electrically connected to the fourth gate,
wherein one of the first source and the first drain is electrically connected to one of the second source and the second drain,
wherein one of the first source and the first drain is electrically connected to one of the seventh source and the seventh drain,
wherein the second gate is electrically connected to one of the third source and the third drain;
wherein the second gate is electrically connected to one of the fourth source and the fourth drain,
wherein the second gate is electrically connected to the sixth gate,
wherein the second gate is electrically connected to the eighth gate,
wherein the other of the second source and the second drain is electrically connected to a first power source,
wherein the third gate is electrically connected to a second input terminal,
wherein the other of the third source and the third drain is electrically connected to a second power source, wherein the other of the fourth source and the fourth drain is electrically connected to the first power source, wherein the fifth gate is electrically connected to the other of the seventh source and the seventh drain, wherein the fifth gate is electrically connected to one of the eighth source and the eighth drain, wherein one of the fifth source and the fifth drain is electrically connected to one of the sixth source and the sixth drain, wherein the other of the fifth source and the fifth drain is electrically connected to a third input terminal, wherein the other of the sixth source and the sixth drain is electrically connected to the first power source, and wherein the other of the eighth source and the eighth drain is electrically connected to the first power source.

2. The semiconductor device according to claim 1, further comprising a capacitor comprising a first electrode and a second electrode, wherein the first electrode is electrically connected to the fifth gate, and wherein the second electrode is electrically connected to one of the fifth source and the fifth drain.

3. The semiconductor device according to claim 1, wherein the other of the first source and the first drain is electrically connected to the first gate.

4. The semiconductor device according to claim 1, wherein a potential of the first power source is lower than a potential of the second power source.

5. The semiconductor device according to claim 1, wherein the first transistor, the second transistor, the third transistor, the fourth transistor, the fifth transistor, the sixth transistor and the seventh transistor have a same conductivity type.

6. A shift register comprising the semiconductor device according to claim 1.

7. An electronic equipment using the shift register according to claim 6.

8. A semiconductor device comprising:
a first transistor comprising a first gate, a first source, and a first drain;
a second transistor comprising a second gate, a second source, and a second drain;
a third transistor comprising a third gate, a third source, and a third drain;
a fourth transistor comprising a fourth gate, a fourth source, and a fourth drain;
a fifth transistor comprising a fifth gate, a fifth source, and a fifth drain;
a sixth transistor comprising a sixth gate, a sixth source, and a sixth drain;
a seventh transistor comprising a seventh gate, a seventh source, and a seventh drain; and
an eighth transistor comprising an eighth gate, an eighth source, and an eighth drain,
wherein the first gate is electrically connected to a first input terminal,
wherein the first gate is electrically connected to the fourth gate, wherein one of the first source and the first drain is electrically connected to one of the second source and the second drain, wherein one of the first source and the first drain is electrically connected to one of the seventh source and the seventh drain, wherein the second gate is electrically connected to one of the third source and the third drain, wherein the second gate is electrically connected to one of the fourth source and the fourth drain, wherein the second gate is electrically connected to the sixth gate, wherein the second gate is electrically connected to the eighth gate, wherein the other of the second source and the second drain is electrically connected to a first power source, wherein the third gate is electrically connected to a second input terminal, wherein the other of the third source and the third drain is electrically connected to a second power source, wherein the other of the fourth source and the fourth drain is electrically connected to the first power source, wherein the fifth gate is electrically connected to the other of the seventh source and the seventh drain, wherein the fifth gate is electrically connected to one of the eighth source and the eighth drain, wherein one of the fifth source and the fifth drain is electrically connected to an output terminal and one of the sixth source and the sixth drain, wherein the other of the fifth source and the fifth drain is electrically connected to a third input terminal, wherein the other of the sixth source and the sixth drain is electrically connected to the first power source, and wherein the other of the eighth source and the eighth drain is electrically connected to the first power source.

9. The semiconductor device according to claim 8, further comprising a capacitor comprising a first electrode and a second electrode, wherein the first electrode is electrically connected to the fifth gate, and wherein the second electrode is electrically connected to one of the fifth source and the fifth drain.

10. The semiconductor device according to claim 8, wherein the other of the first source and the first drain is electrically connected to the first gate.

11. The semiconductor device according to claim 8, wherein a potential of the first power source is lower than a potential of the second power source.

12. The semiconductor device according to claim 8, wherein the first transistor, the second transistor, the third transistor, the fourth transistor, the fifth transistor, the sixth transistor and the seventh transistor have a same conductivity type.

13. A shift register comprising the semiconductor device according to claim 8.

14. An electronic equipment using the shift register according to claim 13.

* * * * *

UNITED STATES PATENT AND TRADEMARK OFFICE
CERTIFICATE OF CORRECTION

PATENT NO. : 8,798,226 B2  
APPLICATION NO. : 13/760147  
DATED : August 5, 2014  
INVENTOR(S) : Shou Nagao et al.

Page 1 of 1

It is certified that error appears in the above-identified patent and that said Letters Patent is hereby corrected as shown below:

In the Specification

Column 2, line 30 – replace "dock" with --clock--;

Column 7, line 62 – after "transistor" insert --,--;

Column 7, line 65 – after "invention" insert --,--;

Column 8, line 45 – replace "dock" with --clock--;

Column 9, line 37 – after "and" delete ",";

Column 10, line 33 – replace "Agate" with --A gate--; and

In the Claims

Column 14, line 55, claim 1 – after "drain" replace ";" with --,--.

Signed and Sealed this  
Ninth Day of June, 2015

Michelle K. Lee  
*Director of the United States Patent and Trademark Office*